(12) United States Patent
Sawyer et al.

(10) Patent No.: US 11,947,491 B2
(45) Date of Patent: Apr. 2, 2024

(54) APPARATUS AND METHODS FOR GEOMETRIC SEARCHING

(71) Applicant: Paperless Parts, Inc., Boston, MA (US)

(72) Inventors: Scott M. Sawyer, Auburndale, MA (US); Dana A. Wensberg, Boston, MA (US); Jason Ray, Boston, MA (US); William H. Headrick, IV, Boston, MA (US); John Peck, Boston, MA (US); Lucas M. Duros, Dorchester, MA (US); James L. Jacobs, II, Rye, NH (US)

(73) Assignee: Paperless Parts, Inc., Boston, MA (US)

( * ) Notice: Subject to any disclaimer, the term of this patent is extended or adjusted under 35 U.S.C. 154(b) by 0 days.

(21) Appl. No.: 17/702,352

(22) Filed: Mar. 23, 2022

(65) Prior Publication Data

US 2022/0222208 A1    Jul. 14, 2022

Related U.S. Application Data

(63) Continuation-in-part of application No. 17/558,711, filed on Dec. 22, 2021, now Pat. No. 11,507,060.
(Continued)

(51) Int. Cl.
*G06F 15/16*    (2006.01)
*G06F 16/13*    (2019.01)
(Continued)

(52) U.S. Cl.
CPC ............ *G06F 16/148* (2019.01); *G06F 16/13* (2019.01); *G06F 16/144* (2019.01); *G06F 16/156* (2019.01); *G06N 20/00* (2019.01)

(58) Field of Classification Search
None
See application file for complete search history.

(56) References Cited

U.S. PATENT DOCUMENTS 7,266,419 B2    9/2007    Sakai et al.
7,778,995 B2    8/2010    Qamhiyah et al.
(Continued)

OTHER PUBLICATIONS

Angelo et al. Search for the Optimal Build Direction in Additive Manufacturing Technologies: A Review. JMMP Jul. 2020, 4, 71. pp. 1-26. (Year: 2020).*

(Continued)

*Primary Examiner* — Alex Gofman
*Assistant Examiner* — Shelly X Qian
(74) *Attorney, Agent, or Firm* — Caldwell Intellectual Property Law

(57) ABSTRACT

In an aspect an apparatus for geometric part searching is presented. An apparatus includes at least a processor and a memory communicatively connected to the at least a processor. At least a processor is configured to generate a search index as a function of a plurality of part specification files. At least a processor is configured to receive an input part specification file. At least a processor is configured to generate a query for an input part as a function of an input part specification file and a search index. A query is configured to output a comparison of an input part specification file to a part estimation specification file. At least a processor is configured to identify a matching part estimation file from a plurality of query results.

20 Claims, 5 Drawing Sheets

Related U.S. Application Data

(60) Provisional application No. 63/213,952, filed on Jun. 23, 2021, provisional application No. 63/129,066, filed on Dec. 22, 2020.

(51) Int. Cl.
*G06F 16/14* (2019.01)
*G06N 20/00* (2019.01)

(56) References Cited

U.S. PATENT DOCUMENTS

| | | | |
|---|---|---|---|
| 9,348,877 | B2 | 5/2016 | Ramani et al. |
| 2011/0047140 | A1 | 2/2011 | Free |
| 2012/0061027 | A1* | 3/2012 | Short ............... B23K 20/103 156/580.1 |
| 2013/0080443 | A1 | 3/2013 | Regli et al. |
| 2017/0004621 | A1 | 1/2017 | Maranzana |
| 2019/0138615 | A1* | 5/2019 | Huh ..................... G06F 16/38 |
| 2019/0236489 | A1 | 8/2019 | Koudal et al. |
| 2021/0004369 | A1 | 1/2021 | Jones et al. |

OTHER PUBLICATIONS

Cambazoglu et al. Scalability and Efficiency Challenges in Large-Scale Web Search Engines. SIGIR'16, pp. 1223-1226. (Year: 2016).*

Devitt. Axis of Rotation Metrology for Improving Gear Manufacturing. BearingNews, Feb. 21, 2018, pp. 1-11. (Year: 2018).*

Dunaj et al. Increasing Damping of Thin-Walled Structures Using Additively Manufactured Vibration Eliminators. Materials 2020, 13:9, pp. 2125. (Year: 2020).*

Singh et al. Multi-Material Additive Manufacturing of Sustainable Innovative Materials and Structures. Polymers 2019, 11:1, pp. 62. (Year: 2019).*

Kraska et al. The Case for Learned Index Structures. SIGMOD'18, 2018, pp. 489-504 (Year: 2018).*

Dunaj et al. teaches vibrational quality features in Increasing Damping of Thin-Walled Structures Using Additively Manufactured Vibration Eliminators. Materials 2020, 13:9, pp. 2125. (Year: 2020).*

S. Bickel, C. Sauer, B. Schleich, S. Wartzack, Comparing CAD part models for geometrical similarity: A concept using machine learning algorithms, Dec. 31, 2021.

Natraj Iyer, Subramaniam Jayanti, Kuiyang Lou, Yagnanarayanan Kalyanaraman, Karthik Ramani, Shape-based searching for product lifecycle applications, Dec. 31, 2005.

Stefan Berchtold and Hans-Peter Kriegel, S3: similarity search in CAD database systems, Dec. 31, 1997.

R. Sung, H. J. Rea, J. R. Corney, D. E. R. Clark, J. Pritchard, M. L. Breaks, R. A. Macleod, Assessing the Effectiveness of Filters for Shape Matching, Jun. 3, 2008.

Natraj Iyer, Subramaniam Jayanti, Kuiyang Lou, Yagnanarayanan Kalyanaraman, Karthik Ramani, Three-dimensional shape searching: state-of-the-art review and future trends, Dec. 31, 2005.

* cited by examiner

APPARATUS AND METHODS FOR GEOMETRIC SEARCHING

CROSS-REFERENCE TO RELATED APPLICATIONS

This application is a continuation in part of U.S. Nonprovisional application Ser. No. 17/558,711, filed on Dec. 22, 2021, which claims the benefit of priority of U.S. Provisional Patent Application Ser. No. 63/129,066 filed on Dec. 22, 2020, and titled "METHODS AND SYSTEMS OF SECURE, MACHINE-ASSISTED COLLABORATION FOR REGULATED MANUFACTURING DATA", and U.S. Provisional Patent Application Ser. No. 63/213,952, filed on Jun. 23, 2021, and titled "METHODS AND SYSTEMS OF SECURE, MACHINE-ASSISTED COLLABORATION FOR REGULATED MANUFACTURING DATA", each of which is incorporated by reference herein in their entirety.

FIELD OF THE INVENTION

The present invention generally relates to the field of geometric searching. In particular, the present invention is directed to an apparatus and method for geometric searching of a part.

BACKGROUND

Modern systems and methods for part searching pose a wide array of variables to account for in order to locate a specific part. Sorting through the wide array of variables to find a matching or best matching part is time consuming in itself. As such, modern systems and methods of part searching are inefficient and can be improved.

SUMMARY OF THE DISCLOSURE

In an aspect an apparatus for geometric part searching is presented. An apparatus includes at least a processor and a memory communicatively connected to the at least a processor. A memory contains instructions configuring the at least a processor to receive a plurality of part specification files. At least a processor is configured to generate a search index as a function of a plurality of part specification files. A search index is configured to determine a scalar variable of at least a geometric feature of each part specification file of a plurality of part specification files. A search index is configured to map at least a part specification file of a plurality of part specification files to another part specification file of a part specification file database. At least a processor is configured to receive an input part specification file. At least a processor is configured to generate a query for an input part as a function of an input part specification file and a search index. A query is configured to match a plurality of geometric features of an input part specification file to a part estimation specification file as a function of a geometric threshold. A query is configured to match a dimensional element of an input part specification file to a dimensional element of a part estimation specification file as a function of a dimensional element threshold. A query is configured to output a comparison of an input part specification file to a part estimation specification file. At least a processor is configured to identify a matching part estimation file from a plurality of query results. At least a processor may be configured to identify the closest K similar parts from an input part specification file.

In another aspect a method of geometric part searching using a computing device is presented. A method includes receiving a plurality of part specification files. A method includes generating a search index as a function of a plurality of part specification files. A search index is configured to determine a scalar variable of at least a geometric feature of each part specification file of a plurality of part specification files. A search index is configured to map at least a part specification file of a plurality of part specification files to another part specification file of a part specification file database. A method includes receiving an input part specification file. A method includes generating a query for an input part as a function of an input part specification file and a search index. A query is configured to match a plurality of geometric features of an input part specification file to a part estimation specification file as a function of a geometric threshold. A query is configured to match a dimensional element of an input part specification file to a dimensional element of a part estimation specification file as a function of a dimensional element threshold. A query is configured to output a comparison of an put part specification file to a part estimation specification file. A method includes identifying a matching part estimation specification file from a plurality of query results.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
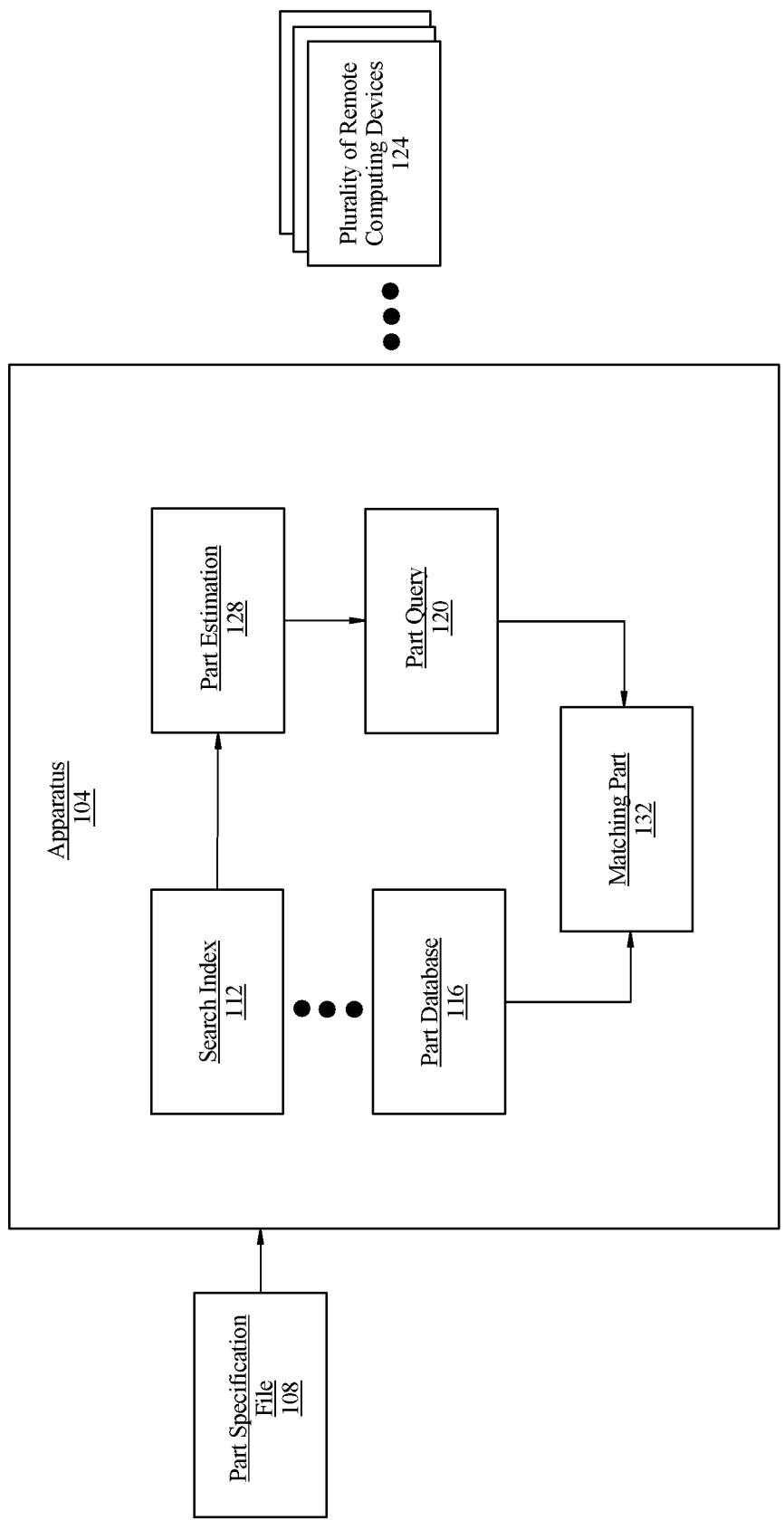
FIG. 1 is a block diagram of an apparatus for geometric searching of a part.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

Described herein is an apparatus for geometric part searching. An apparatus may include at least a processor and a memory communicatively connected to the at least a processor. A memory may contain instructions configuring the at least a processor to receive a plurality of part specification files. At least a processor may be configured to generate a search index as a function of a plurality of part specification files. A search index may be configured to determine a scalar variable of at least a geometric feature of each part specification file of a plurality of part specification files. A search index may be configured to map at least a part specification file of a plurality of part specification files to another part specification file of a part specification file database. At least a processor may be configured to receive an input part specification file. At least a processor may be configured to generate a query for an input part as a function of an input part specification file and a search index. A query may be configured to match a plurality of geometric features of an input part specification file to a part estimation specification file as a function of a geometric threshold. A query may be configured to match a dimensional element of an input part specification file to a dimensional element of a part estimation specification file as a function of a dimensional element threshold. A query may be configured to output a comparison of an input part specification file to a part estimation specification file. At least a processor may be configured to identify a matching part estimation file from a plurality of query results.

Described herein is a method of geometric part searching using a computing device. A method may include receiving a plurality of part specification files. A method may include generating a search index as a function of a plurality of part specification files. A search index may be configured to determine a scalar variable of at least a geometric feature of each part specification file of a plurality of part specification files. A search index may be configured to map at least a part specification file of a plurality of part specification files to another part specification file of a part specification file database. A method may include receiving an input part specification file. A method may include generating a query for an input part as a function of an input part specification file and a search index. A query may be configured to match a plurality of geometric features of an input part specification file to a part estimation specification file as a function of a geometric threshold. A query may be configured to match a dimensional element of an input part specification file to a dimensional element of a part estimation specification file as a function of a dimensional element threshold. A query may be configured to output a comparison of an input part specification file to a part estimation specification file. A method may include identifying a matching part estimation specification file from a plurality of query results.

Systems, apparatuses, and methods described in this disclosure may perform and/or support one or more manufacturing processes and/or process steps. Manufacturing, as described herein, may be performed according to any manufacturing process or combination of manufacturing processes. Manufacturing process may include an additive manufacturing process. In an embodiment, an additive manufacturing process is a process in which material is added incrementally to a body of material in a series of two or more successive steps. A material may be added in the form of a stack of incremental layers; each layer may represent a cross-section of an object to be formed upon completion of an additive manufacturing process. Each cross-section may, as a non-limiting example be modeled on a computing device as a cross-section of graphical representation of the object to be formed; for instance, a computer aided design (CAD) tool may be used to receive or generate a three-dimensional model of an object to be formed, and a computerized process, such as a "slicer" or similar process, may derive from that model a series of cross-sectional layers that, when deposited during an additive manufacturing process, together will form the object. Steps performed by an additive manufacturing system to deposit each layer may be guided by a computer aided manufacturing (CAM) tool. Persons skilled in the art will be aware of many alternative tools and/or modeling processes that may be used to prepare a design for additive manufacture, including without limitation the production of stereolithography (STL) files and the like. In an embodiment, a series of layers are deposited in a substantially radial form, for instance by adding a succession of coatings to the workpiece. Similarly, a material may be added in volumetric increments other than layers, such as by depositing physical voxels in rectilinear form or other forms. Additive manufacturing, as used in this disclosure, may include manufacturing done at an atomic or nano level. Additive manufacturing may also include manufacturing bodies of material that are produced using hybrids of other types of manufacturing processes; for instance, additive manufacturing may be used to join together two portions of a body of material, where each portion has been manufactured using a distinct manufacturing technique. A non-limiting example may be a forged body of material. an example of a forged body of material may have welded material deposited upon it, which then comprises an additive manufactured body of material.

Deposition of material in an additive manufacturing process may be accomplished by any suitable means, including without limitation any "three-dimensional printing" process. Deposition may be accomplished by stereo lithography, in which successive layers of polymer material are deposited and then caused to bind with previous layers using a curing process such as curing using ultraviolet light, for example. Additive manufacturing processes may include fused deposition modeling processes, in which a polymer material is deposited in a molten or otherwise fluid form in successive layers, each of which is cured by natural cooling or other means. Additive manufacturing processes may include processes that deposit successive layers of powder and binder; the powder may include polymer or ceramic powder, and the binder may cause the powder to adhere, fuse, or otherwise join into a layer of material making up the body of material or product.

Likewise, additive manufacturing may be accomplished by immersion in a solution that deposits layers of material on a body of material, by depositing and sintering materials having melting points such as metals, such as selective laser sintering, by applying fluid or paste-like materials in strips or sheets and then curing that material either by cooling, ultraviolet curing, and the like, any combination of the above methods, or any additional methods that involve depositing successive layers or other increments of material. Methods of additive manufacturing may include without limitation vat polymerization, material jetting, binder jetting, material extrusion, fuse deposition modeling, powder bed fusion, sheet lamination, and directed energy deposition. Methods of additive manufacturing may include adding material in increments of individual atoms, molecules, or other particles. An additive manufacturing process may use a single method of additive manufacturing or combine two or more methods. Companies producing additive manufacturing equipment include 3D Systems, Stratasys, formLabs, Carbon3D, Solidscape, voxeljet, ExOne, envisiontec, SLM Solutions, Arcam, EOS, Concept Laser, Renishaw, XJET, HP, Desktop Metal, Trumpf, Mcor, Optomec, Sciaky, and MarkForged amongst others.

Examples of additively manufactured bodies of material include, but are not limited to, plates, slabs, blooms, billets, boards, blocks, among many other shapes, including curvilinear and multisided shapes, and any combination thereof, as set forth in further detail below. As for material(s) composing an additively manufactured body of material, the material(s) may be any suitable material(s), such as metal (solid, sintered, etc.), polymer (solid, foamed, etc.), composite, and multilayer material, or any combination of such materials, among others. Additively manufactured bodies of material may include shapes, such as organic shapes, which have been scanned, for instance and without limitation using LIDAR or similar scanning techniques; scanned shapes may be comprised of primitive shapes, which may be mapped and then additively manufactured. Fundamentally, there is no limitation on the composition of an additively manufactured body of material.

Manufacturing methods may include one or more subtractive processes. As used herein, a subtractive manufacturing process is a process that is performed by removal of material from a workpiece. A subtractive manufacturing process may be any suitable subtractive manufacturing process, such as, but not limited to, rotary-tool milling, electronic discharge machining, ablation, etching, erosion, cutting, and cleaving, among others. Fundamentally, there is no limitation on the type of subtractive manufacturing process(es) that may be used. In an example, differing subtractive manufacturing processes may be used before at different stages or to perform different steps of the subtractive manufacturing process as described below.

If rotary-tool milling is utilized, this milling may be accomplished using any suitable type of milling equipment, such as milling equipment having either a vertically or horizontally oriented spindle shaft. Examples of milling equipment include bed mills, turret mills, C-frame mills, floor mills, gantry mills, knee mills, and ram-type mills, among others. In an embodiment, milling equipment used for removing material may be of the computerized numerical control (CNC) type that is automated and operates by precisely programmed commands that control movement of one or more parts of the equipment to effect the material removal. CNC machines, their operation, programming, and relation to CAM tools and CAD tools are well known and need not be described in detail herein for those skilled in the art to understand the scope of the present invention and how to practice it in any of its widely varying forms.

Subtractive manufacturing may be performed using spark-erosive devices; for instance, subtractive manufacturing may include removal of material using electronic discharge machining (EDM). EDM may include wire EDM, plunge EDM, immersive EDM, ram EDM, or any other EDM manufacturing technique. Subtractive manufacturing may be performed using laser-cutting processes. Subtractive manufacturing may be performed using water-jet or other fluid-jet cutting techniques. Fundamentally, any process for removal of material may be employed for subtractive manufacturing.

Manufacturing processes may include molding processes. As used herein, a molding process may be any process wherein a malleable material, defined as a material that adopts the shape of a cavity into which it is inserted, is inserted into a cavity in an object, known as a "mold," formed to impose a desired shape on material inserted therein. Malleable material may include, without limitation, molten metal or polymer material, fluids curable through heat, chemical reaction, or radiation, froths composed of malleable material with bubbles dispersed therethrough, putty or clay-like malleable solids, and the like. Insertion may be accomplished by pouring, pressing, blowing, injecting, or otherwise introducing malleable material into the cavity of the mold. Malleable material may be cured or otherwise allowed to solidify or become more viscous; this process may be accomplished by allowing materials to cool until they enter a solid or more viscous state, heating to change the chemical nature of materials, curing by irradiation such as ultraviolet radiation, curing by mixture of chemicals to produce a solid or more viscous substance, and the like. Molding processes may include, without limitation, injection molding, blow molding, compression molding, extrusion molding, matrix molding, laminating, or any other molding process.

Manufacturing processes may include one or more processes for the manipulation of sheet material. Sheet material may be any material presented in a sheet of substantially uniform thickness, including without limitation sheets of metal, polymer material such as plastic, and the like. Manipulation of sheets of material may include, without limitation, bending, stretching, cutting, and/or stamping the material. Manipulation may be performed, as a non-limiting example, using one or more cutting or stamping dies.

Manufacturing processes may include finishing and/or coating processes. Finishing and/or coating may be a process in which additive, subtractive, or other methods are used to create a desired surface characteristic or the like in a completed product or component. Finishing and/or coating may include polishing or smoothing processes. Finishing and/or coating may include deposition of material on one or more surfaces of a workpiece, part, or component. Finishing and/or coating may include, without limitation, painting, grinding, dying, laser ablation, laser engraving, polymer coating, plating with metals, abrasive blasting, burnishing, buffing, such as by electroplating, blanching, case-hardening, peening, burnishing, glazing, cladding, conversion coating, knurling, galvanizing, varnishing, plasma-s praying, corona treatment, application of vitreous enamel, thin-film deposition, magnetic field-assisted finishing, or any other suitable treatment for producing a finished surface.

Referring now to FIG. 1, an exemplary embodiment of an apparatus 104 for geometric searching of a part is illustrated. Apparatus 104 may include at least a processor and a memory communicatively connected to the at least a processor. A memory may contain instructions configured the at least a processor to perform various tasks. As used in this disclosure, "communicatively connected" means connected by way of a connection, attachment or linkage between two or more relata which allows for reception and/or transmittance of information therebetween. For example, and without limitation, this connection may be wired or wireless, direct or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

Still referring to FIG. 1, in some embodiments, apparatus 104 may include a computing device. A computing device may include any computing device as described in this disclosure, including without limitation a microcontroller, microprocessor, digital signal processor (DSP) and/or system on a chip (SoC) as described in this disclosure. Apparatus 104 may include, be included in, and/or communicate with a mobile device such as a mobile telephone or smartphone. Apparatus 104 may include a single computing device operating independently, or may include two or more computing device operating in concert, in parallel, sequentially or the like; two or more computing devices may be included together in a single computing device or in two or more computing devices. Apparatus 104 may interface or communicate with one or more additional devices as described below in further detail via a network interface device. Network interface device may be utilized for connecting apparatus 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Apparatus 104 may include but is not limited to, for example, a computing device or cluster of computing devices in a first location and a second computing device or cluster of computing devices in a second location. Apparatus 104 may include one or more computing devices dedicated to data storage, security, distribution of traffic for load balancing, and the like. Apparatus 104 may distribute one or more computing tasks as described below across a plurality of computing devices of computing device, which may operate in parallel, in series, redundantly, or in any other manner used for distribution of tasks or memory between computing devices. Apparatus 104 may be implemented using a "shared nothing" architecture in which data is cached at the worker, in an embodiment, this may enable scalability of a system and/or apparatus 104.

With continued reference to FIG. 1, apparatus 104 may be designed and/or configured to perform any method, method step, or sequence of method steps in any embodiment described in this disclosure, in any order and with any degree of repetition. For instance, apparatus 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Apparatus 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Still referring to FIG. 1, apparatus 104 is configured to receive and/or store a part specification file 108. A "part specification file" as used in this disclosure is a document and/or file, or plurality of documents and/or files, describing one or more features of an object and/or part. Part specification file 108 may include one or more files describing an object and/or part to be manufactured. Part specification file 108 may be assigned a unique number or code by the entity procuring the part to be manufactured. A unique identifier may be a locally unique identifier; that is, it may uniquely identify a part specification file 108 within system 100. More generally unique identifiers may be used, including, without limitation, globally unique identifiers (GUIDs) or universally unique identifiers (U-UDs). Part specification file 108 may include a combination of engineering drawings, 3D models in some open or proprietary format, documents (including contracts), third-party specifications (including MILSPEC), and more. For instance, and without limitation, part specification file 108 may include a graphical model of a part. A graphical model may be any model used to simulate visually one or more features of the part, including without limitation a CAD file, CAM file, STL file, or the like. A graphical model may be stored in a memory of apparatus 104 in any suitable manner. In some embodiments, one or more features of a part may include any geometric shape to be formed on the part by any manufacturing process. One or more features of a part may include one or more materials or combinations of materials that will make up the part, a finish of the part, an intended physical characteristic of the part such as hardness, flexibility, or the like, or any other detail concerning the manufacture of the part.

Still referring to FIG. 1, part specification file 108 may include one or more annotated files, which may include without limitation files generated by a document-producing program such as a word processor, image manipulation program or portable document format (PDF) program; at least a document-producing program may be usable to produce a document containing a combination of images, such as views of models of products to be manufactured, with text including instructions by users of manufacturer and/or designer client devices and/or other users indicating a manner in which such users wish for manufacture of the products to be manufactured to be performed. Part specification file 108 may be used to describe a part that may be developed by mechanical engineers, industrial designers, and/or part designers with other qualifications. An objective of part specification file 108 may be to communicate a part's form, fit and function. Generally, part specification file 108 may not indicate how a part should be manufactured, but rather may define acceptance criteria for individual parts. In some cases, part specification file 108 may include complete or partial manufacturing instructions, typically when there is no obvious way to manufacture a part to specification and when designers create the part specification file 108 with certain manufacturing constraints in mind. The following is a non-limiting list of examples of criteria that may be included in part specification file 108: material (including references to national or global standards or to other third-party specifications); material properties (including chemical, mechanical, magnetic, optical, electrical, and the like); shape/geometry (as defined by perspective drawings or a digital 3D model); tolerances (critical measurement points and their acceptable tolerances); surface finish; markings; hole taps or inserts; hardware and fasteners; finishing (including chemical or electrical plating, paint, coatings, and abrasive treatments); washing and/or de-greasing; quality requirements (including measurement sampling and adherence to manufacturing quality standards); and/or packaging requirements.

In some embodiments, and still referring to FIG. 1, part specification file 108 may be proprietary in nature; for instance, part specification file 108 may represent intellectual property of the company procuring the parts, or on whose behalf a third-party is procuring the parts. Part specification file 108 may be subject to additional regulation, such International Traffic in Arms Regulations (ITAR), other types of export control, and/or other regulations that require special handling of sensitive data. Part specification file 108 may change over time. In some cases, a change may be indicated by a change in a part number and/or another code or identifier, and/or by a revision number or code. In other cases, part specification file 108 may be updated without an associated change in title or metadata. "Metadata" as used in this disclosure is a set of data that describes and gives information about other data.

Still referring to FIG. 1, apparatus 104 may determine a scalar variable as a function of at least a geometric feature of part specification file 108. "Geometric features" as used in this disclosure are characteristics pertaining to an object's shape. In some embodiments, geometric features may include, but are not limited to, angle quantity, angle size, surface area, curvature, surface shape, and the like. Geometric features may include one or more scalar variables. A "scalar variable" as used in this disclosure is a numerical value that defines a vector space. Scalar variables may include, but are not limited to, heights, weights, widths, volumes, part extents along each unit axis, part extents along each principal axis, number of faces, number of edges, number of faces of each type as described by a boundary representation format (such as STEP), a measure of part complexity, the geometry's center of gravity coordinate along each axis, aspect ratio along each combination of axes (e.g., XY, YZ, ZX), Spies ratio, and the like.

Still referring to FIG. 1, apparatus 104 may analyze a geometric feature of part specification file 108 to determine a scalar variable of the geometric feature. Apparatus 104 may calculate a scalar variable based on values of one or more geometric features of part specification file 108. As a non-limiting example, a scalar variable representing part complexity may be described by a single scalar value by computing a value based on the area of each face in the part's geometry, denoted $a_f$ for each face f, and summing those values, for example according to the following formula whereby parts with many smaller faces are considered more complex than parts with fewer larger faces:

$$\sum_f \frac{\log(1 + a_f)}{a_f}.$$

As another non-limiting example, a scalar variable may include a weight of an object, such as 45 lbs.

With continued reference to FIG. 1, apparatus 104 may be configured to generate a search index 112 as a function of one or more scalar variables and/or part specification file 108. A "search index" as used in this disclosure is a data structure that is configured to compare and/or match data. Search index 112 may map one or more parts to one or more other parts of part database 116. In some embodiments, search index 112 may be configured to compare and/or map part specification file 108 to one or more other parts of part database 116. Search index 112 may compare a part's geometric features to geometric features of one or more parts of part database 116.

Still referring to FIG. 1, in a non-limiting example, part specification file 108 may include a metal rod. Search index 112 may compare the geometry of the metal rod of part specification file 108 to other parts of part database 116. Search index 112 may compare a length, circumference, diameter, thickness, and/or other geometric features of the metal rod to part database 116. Search index 112 may link two or more parts of part database 116 by geometric features. In some embodiments, search index 112 may utilize a prior linking of two or more parts of part database 116 for quicker part searching. In a non-limiting example, search index 112 may link a first shaped metal rod having a length of 4 ft to a second shaped metal rod having a length of 3.5 ft. Search index 112 may use the linking of the first shaped metal rod and the second shaped metal rod to locate another shaped metal rod. In some embodiments, search index 112 may link two or more parts based on part criteria not inherently specified by part specification file 108. In a non-limiting example, part specification file 108 may include a metal sheet having a meshed grid-like surface. Search index 112 may compare and/or map parts of part database 116 to locate a similar metal sheet having a meshed grid-like surface. Search index 112 may also map other part features of the metal sheet having a meshed grid-like surface, such as but not limited to, width, height, thickness, angles, material, surface area, and the like. Search index 112 may locate and/or map parts having a similar dimension, material, and the like to the metal sheet having a meshed grid-like surface. In some embodiments, search index 112 may prioritize a geometric feature to map and/or link. Search index 112 may give a weight to one or more geometric features of part specification file 108 when indexing parts of part database 116. A weight may include, but is not limited to, a numerical value corresponding to an importance of an element. In some embodiments, a weighted value may be referred to in terms of a whole number, such as 1, 100, and the like. As a non-limiting example, a weighted value of 0.2 may indicated that the weighted value makes up 20% of the total value. As a non-limiting example, part specification file 108 may include an aluminum rod. Search index 112 may give a weight of 0.8 to the aluminum rod's length, and a weight of 0.2 to the aluminum rod's material. Search index 112 may map a plurality of rods having similar dimensions to the aluminum rod with differing materials than the aluminum rod's due to the lower weight value paired to the aluminum rod's material. In another non-limiting example, part specification file 108 may include an aluminum rod and search index 112 may attribute a weight of 0.6 to the material of the aluminum rod and a weight of 0.4 to the dimensions of the aluminum rod. Search index 112 may generate a mapping of a plurality of parts including an aluminum material with higher dimensional value differences due to the lower weight attributed to the dimensions of the aluminum rod. In some embodiments, search index 112 may pair one or more weighted values to one or more part attributes. Weighted values may be received from part specification file 108 and/or from a user input to apparatus 104. In some embodiments, search index 112 may generate weighted values based on prior part mappings.

Still referring to FIG. 1, in some embodiments, search index 112 may be stored in a table of a relational database management system (RDMS). A table, such as a table of part database 116, may be organized such that each row represents a part, and each column represents a scalar attribute of that part. Columns may include any of the aforementioned scalar attributes, which may be stored, in a non-limiting example, as floating point or decimal numbers. An additional column or columns may contain identifiers for a part so the part may be uniquely identified, such as by part number, revision, owner, and/or a randomly assigned identifier such as without limitation a globally unique identifier (GUID). One or more of columns of a table may be indexed by a RDMS, for example using a B-tree, which may enable efficient filtering of the one or more columns. In some embodiments, an RDMS may enable a querying of a large number of parts, perhaps millions, and reduce the parts to a table that may be queried using Structured Query Language (SQL) or the like. An RDMS database system may be configured to find similar parts as a function of a new query part and finding identical parts to the new query part. A database query may be constructed to identify any parts that may have identical geometry to part query 120, even if an identifying metabase, such as but not limited to part number, may be different and part specification file 108 itself may not be a perfect binary match. As a non-limiting example, two CAD files describing identical geometry may actually differ in their binary content for a variety of reasons, including use of different CAD system or format, a floating point precision of a computer used to generate the file, rotations of translations of the geometry in the Euclidean coordinate system, and/or differences in metadata introduced by the CAD system. Continuing this non-limiting example, even given a non-identical CAD file and non-matching part number, a table may be queried using the following method to identify identical geometries. First, the query geometry may be interrogated to produce a same set of scalar attributes corresponding to the columns of the table. Next, a part query may be constructed, for example using SQL, to filter the table for rows where all columns contain a value very close numerically to the query part's values. For example, the table may contain three columns of scalar attributes called "col1", "col2", and "col3" and the query part's corresponding attributes may be called "val1", "val2", and "val3". Furthering this example, a small difference in values may be tolerated to account for floating point precision and other insignificant changes in the geometries, and that tolerance is described by the variable epsilon=0.0001. In this example, a SQL query that returns identical part numbers may be constructed:

SELECT part number FROM search_index WHERE ABS(col1-val1)<epsilon AND ABS(col2-val2)<epsilon AND ABS(col3-val3)<epsilon;

where ABS( ) is an absolute value function. Queries similar to the above example, may be extended to any number of columns by appending additional "AND" clauses. In the second use case, similar-but-not-identical parts may be identified by increasing epsilon to allow for larger differences between the parts. For example, epsilon may be increased by a factor of 1000 or different epsilon may be used for different columns to account for the variability of that particular column within the database. Such a method may be demonstrated to identify parts with minor differences, such as a drilled hole that has been relocated slightly, for example by moving the drilled hole one inch across a face of a part. Further, search index 112 may be seeded with geometric information about common parts, including but not limited to, fasteners, screws, bolts and the like. Commercial databases may include CAD descriptions of common parts. CAD files may be interrogated and indexed such that part query 120 may be matched to common geometries. It is worth noting that in a case where two part specification files 108 have identical binary content, matches may be quickly identified by processes such as, but not limited to, computing a one-way hash (using an algorithm like MD5, SHA-256 or the like), checksum, or the like and comparing that hash, checksum, or the like to previously computed hash values stored in search index 112.

Still referring to FIG. 1, in some embodiments, search index 112 may compare a part's fit criteria to one or more parts in part database 116. A "fit criteria" as used in this disclosure is a set of geometric prerequisites needed for an object to connect to one or more other objects. In some embodiments, a fit criteria may include, but is not limited to, an angle size, a surface shape, a curvature, a concave shape, a convex shape, and the like. In some embodiments, search index 112 may determine a mechanical compatibility between two or more parts. A "mechanical compatibility" as used in this disclosure is a likeliness of a structural connection between two or more parts. In some embodiments, a mechanical compatibility may include a part's ability to combine with one or more other parts. As a non-limiting example, a rivet hole may be mechanically compatible with a rivet, but may not be mechanically compatible with a bolt. In some embodiments, a mechanical compatibility may include a part's ability to distribute kinetic energy. As a non-limiting example, a first part may be rotatable, and a second part may be stationary. The first part and second part may not be mechanically compatible due to their difference in kinetic energy distribution. In some embodiments, a mechanical compatibility may include a malleability difference between two or more parts. In a non-limiting example, a first part may include a steel pipe and a second part may include a copper rod. The steel pipe and copper rod may not be mechanically compatible due to the copper rod's higher malleability. In some embodiments, search index 112 may determine a part may connect or otherwise combine with one or more other parts and/or components. In a non-limiting example, part specification file 108 may include an angled metal bar that fits into a metal doorframe. Search index 112 may compare a fit criteria of the angled metal bar to one or more other parts of part database 116 for a part that fits similarly to the metal doorframe.

Still referring to FIG. 1, in some embodiments, search index 112 may compare scalar value data of one or more parts to one or more parts of part database 116. "Scalar value data" as used in this disclosure is a numerical value having a single component. In some embodiments, scalar value data may include coordinates. Coordinates may include cartesian coordinates, polar coordinates, cylindrical coordinates, spherical coordinates, and/or other coordinates. Search index 112 may compare coordinates of part specification file 108 to one or more parts of part database 116. In a non-limiting example, part specification file 108 may include coordinates of 150$x$, 240$y$, and 300$z$. Search index 112 may compare and/or map the coordinates of part specification file 108 to one or more other parts of part database 116 to find parts having similar coordinates. In some embodiments, scalar value data may include volumes, dimensions, and the like. In some embodiments, search index 112 may compare a part's dimensions to one or more other parts dimensions of part database 116. Search index 112 may compare heights, widths, lengths, thickness, volume, and the like between two or more parts.

Still referring to FIG. 1, in addition to scalar values, in some embodiments a feature of a part's geometry may be described by a vector. A "vector" as used in this disclosure is a is a data structure that represents one or more a quantitative values and/or measures of a part's geometry; each quantitative value of the one or more quantitative values may, as a non-limiting example, include a scalar value and/or variable as described above. A vector may be represented as an n-tuple of values, where n is one or more values, as described in further detail below; a vector may alternatively or additionally be represented as an element of a vector space, defined as a set of mathematical objects that can be added together under an operation of addition following properties of associativity, commutativity, existence of an identity element, and existence of an inverse element for each vector, and can be multiplied by scalar values under an operation of scalar multiplication compatible with field multiplication, and that has an identity element is distributive with respect to vector addition, and is distributive with respect to field addition. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent, for instance as measured using cosine similarity as computed using a dot product of two vectors; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm: $l=\sqrt{\Sigma_{i=0}^{n} a_i^2}$, where $a_i$ is attribute number i of the vector. Scaling and/or normalization may function to make vector comparison independent of absolute quantities of attributes, while preserving any dependency on similarity of attributes.

Still referring to FIG. 1, and as a non-limiting example, a vector may include a 3-vector describing a point in 3D space and/or a direction in 3D space describing an axis, normal of a face, or the like. A vector may include a 4-vector representing a quaternion describing a rotation of a face or edge of a part. Vectors may be stored as one or more scalar values in search index 112 using a variety of methods. In some embodiments, a method may include storing each element of a vector as an independent scalar value. In another embodiment, a method may include storing a vector as a single scalar representing the vector's magnitude, which may be computed as the square root of the sum of the squares of each element. A method may include storing an angle relative to any of the unit axes represented in degrees or radians.

Still referring to FIG. 1, in some embodiments, search index 112 may compare two or more parts based on a part functionality. A "part functionality" as used in this disclosure is a mechanical operation of an object. A part functionality may include a rotationality. A rotationality may include a part's ability to rotate about an axis. In a non-limiting example, part specification file 108 may include a screw. Search index 112 may compare the screw to part database 116 for other parts that have a similar securing function to the screw. In some embodiments, a part functionality may include a sturdiness. A sturdiness may include a part's ability to resist external forces. As a non-limiting example, part specification file 108 may include a metal rod. Search index 112 may compare and/or map other parts of part database 116 to the metal rod based on the metal material, rigidity, and sturdiness of the metal rod. In some embodiments, a part functionality may include a flexibility. A flexibility may include a part's ability to twist, bend, and/or otherwise rotate. As a non-limiting example, part specification file 108 may include a rubber sheet. Search index 112 may compare and/or map one or more other parts of part database 116 to the rubber sheet based on the other parts flexibility and/or elasticity compared to the rubber sheet. In some embodiments, a part functionality may include a part's structural support. A part's structural support may include a part's ability to provide mechanical assistance to one or more other parts. In some embodiments, a part functionality may include vibrational qualities. A part's vibrational qualities may include, but is not limited to, a part's resonant frequency, dampening ability, vibrational transmission ability, and the like.

Still referring to FIG. 1, in some embodiments, search index 112 may include a data model and/or data structure that stores a complete part specification file 108. Search index 112 may store one or more files of part specification file 108 and/or representations thereof, in any suitable file format and/or according to any suitable storage modality. Search index 112 may include links between files or other data modalities; in other words, generation of search index 112 may include generation of links between files or other data modalities. As a non-limiting example, a line or annotation on an engineering drawing may be linked to a corresponding face, edge, or other feature in a 3D model; a link may be a data element indicating that a first representation of a feature in a first file is a second representation of that feature in a second file. For instance, a link may indicate that a two-dimensional depiction of a feature in a first file, such as a face, hole, edge, or the like is a two-dimensional view, such as a side view, a perspective view, an isometric view, or the like, of a feature depicted as a three-dimensional object in a second file; measurements recorded in the depiction in the first file may be identified as the same measurements shown regarding the depiction in the second file, and other attributes recorded in first file may be identified as equivalent to attributes shown in first file. In addition to representing equivalencies, links between features in two or more elements or modalities or files may also carry other semantic meaning as defined by a predicate or set of attributes. For instance, a tolerance specified in GD&T in an engineering drawing may be linked to two elements in a 3D model with the predicate "applies to". This link may be determined automatically by an analysis algorithm, or the link may be established manually by a human operating a graphical or textual user interface. An analysis algorithm may include, without limitation, an algorithm for interrogation, for instance as described in this disclosure and/or in references incorporated by reference herein. One such algorithm may entail comparing features in a 3D representation to features in a 2D representation by projecting 3D features into a 2D representation from a set of various aspects of viewpoints. These 2D projections may be compared to features in a 2D drawing using a technique such as scan matching.

Still referring to FIG. 1, in some embodiments, in order to reduce computational complexity and to make the problem tractable in a reasonable amount of time, heuristics may be applied in search index 112 to limit a set of perspectives that must be considered. For example, an algorithm may assume that 2D drawings are perspective drawings taken pointing in a positive or negative X, Y or Z axis, and/or are other views typically provided and/or used in CAD or other 3D modeling programs; where a file type, metadata, or other information describes a particular 3D modeling program used to generate the 3D file, algorithm may set as default perspectives and/or projections a set of such defaults typically used by the particular program. A further heuristic may be applied to limit the number of scales or distances to be considered by comparing extents of a 2D drawing to a bounding box of a 3D model; alternatively, a metric used to determine closeness of a match may be designed to be scale-independent, such that a 2D drawing proportional to a perspective view is a match without scaling. Pairs of features may be similarly limited based on what features are visible from various perspectives, which may be determined, for example, by ray casting from various points on a face in a 3D model in a direction of a perspective being considered to determine whether that ray interferes with another part of the 3D model.

Still referring to FIG. 1, to further increase the effectiveness and efficiency of a scan matching technique, scan matching may be performed in the Hough Domain, as computed via a Hough Transform of a 2D drawing and a 2D projection of a feature from a 3D model. Scan matching performed by a Hough Transform may find imperfect instances of objects within a certain class of shapes by a voting procedure. A voting procedure may be carried out in a parameter space, from which object candidates may be obtained as local maxima in an accumulator space. A Hough Transform may be used to detect points and/or pixels that may have been missing from part specification files and/or scan matching such as edge detecting. A Hough Transform may be used to more accurately detect lines of geometric features of parts and/or objects of one or more part specification files by estimating two parameters that define a straight line. For instance, and without limitation, a Hough Transform may include a transform space that has two dimensions, with every point in the transform space used as an accumulator to detect or identify a line described by $r=x \cos(\theta)+y \sin(\theta)$. A Hough transform may also be used to more accurately detect planes, cylinders, circles, curves, ellipses, and the like. Apparatus 104 may utilize a Hough Transform to improve generation of search index 112 which may increase an accuracy of a matching of scalar variables, geometric features, and the like of part specification file 108 to part estimation 128 and/or matching part 132.

With continued reference to FIG. 1, various matching criteria may be applied to determine an equivalency, for example by applying a threshold to a Normal Distributions Transform (NDT) score calculated when performing a scan match. An error function representing a difference between a perspective view and a 2D image may alternatively or additionally be minimized to derive a best fit, either by selecting a best-fit perspective view and/or by shifting perspective until the error function is minimized. Any or all of the above-described approaches may be combined in any combination. An analysis algorithm linking entities across data modalities may be provided by a platform owner and/or by a user or that user's organization. Annotations and/or modifications may be made in the modalities (e.g., drawing, 3D model, contract, or other multimedia format) most expressive for that annotation or modification and the associated meaning may be directly or indirectly applied across the other modalities. In other words, apparatus 104 may detect a change in an attribute recorded regarding a feature in a first file and may automatically update a corresponding and/or identical attribute in a second file, as a function of the modification and a link. As a non-limiting example, in one embodiment, a user may select a tolerance specified using standard GD&T markup on an engineering drawing, and link that one or more geometric entities (e.g., faces and edges) in a 3D model. Alternatively, a link between features in a 3D model may be defined directly in or with respect to the 3D model, for example by using model-based definitions. In one embodiment, model-based definitions may be specified in a proprietary format as determined by a CAD system, or using an industry standard such as Quality Information Format (QIF).

Still referring to FIG. 1, dimensioning determined using, e.g., interrogators and/or extraction of textual information be utilized by consumers of 3D data, including humans using a 3D viewer GUI or by a CAM tool making a program for a computer-controlled manufacturing process. Examples of how this annotation may be consumed may include a human estimating a longer cycle time for a manufacturing operation or a CAM tool programming a CNC mill to operate with a different tool or at a different speed to mill a feature with a tight tolerance. In another embodiment, a human user or algorithm may identify a set of geometric faces or edges as a higher-order feature, such a drilled hole or drilled and tapped hole. A human may make this association based on explicit knowledge or by fusing data across different files or modalities. An algorithm may infer these higher-order features using metadata within the CAD file, or by applying heuristics, such as inferring a drilled hole when an inner diameter of a cylinder matches a lookup table of standard hardware sizes within some linear tolerance; heuristics may be derived and/or generated according to any process described in this disclosure and/or in materials incorporated herein by reference. Computing device may then propagate such an inference to other faces and edges with identical or similar properties, for instance by detecting a link as described above and modifying depictions identified in the link, and/or by identifying depictions of features having one or more attributes in common with a feature to which inference was applied. An end result may include one rule or user action resulting in an identification of numerous features, such as holes, pockets, or the like. A 3D model with feature annotations may then be used to make work instructions, routing steps, cycle time estimations, or the like.

Still referring to FIG. 1, in some embodiments, search index 112 may create a mesh representation of one or more parts of part database 116. Search index 112 may perform a Boolean subtract operation in both directions (A-B and B-A) on two parts being compared. In some embodiments, if resulting differences from a Boolean subtract operation both have zero or near-zero volume according to some threshold to account for numerical precision and rounding, it may be possible to conclude that two parts are identical. Search index 112 may analyze and/or identify features of one or more parts, which may be described as numbers and extracted. In some embodiments, features may include, but are not limited to, volume, surface area, center of mass (in x, y, z dimensions), moments of inertia, number of faces, convex hull volume, convex hull surface area, and spies ratio. Part features may be stored in part database 116. In some embodiments, part features may be stored in part database 116 with an identifier for each part and/or component.

Still referring to FIG. 1, search index 112 may be configured to utilize a part matching machine learning model. A part matching machine learning model may be trained with a plurality of training data correlating part data to matching parts. Training data may be received from a user input and/or received iteratively from prior calculations. A part matching machine learning model may be configured to receive part data and output matching parts as a function of a training of the part matching machine learning model. In some embodiments, a part matching machine learning model may include, but is not limited to, a particle swarm optimization, ant colony optimization, genetic algorithms, K-means clustering, and the like. A part matching machine learning model may be described in further detail below with reference to FIG. 3. In some embodiments, a different weight may be applied to each scalar value in search index 112 and query results may be produced by finding the K nearest neighbors, based on Euclidean distance from the vector of weighted scalar values. Weights may be determined via supervised machine learning such that a training set of matching or similar parts may be provided to a regression algorithm, such as, but not limited to, ordinary least squares, LASSO, Ridge, or the like. Weights may be calculated by to minimize an error function defined as the Euclidean distance between matching parts.

Still referring to FIG. 1, apparatus 104 may be configured to classify part specification file 108 into a part category. A "part category" as used in this disclosure is a grouping of parts based on a part geometry. A part category may include, but is not limited to, sheets, gears, screws, bolts, rods, and the like. In some embodiments, apparatus 104 may use a part classification model to classify part specification file 108 to a part category. A "part classification model" as used in this disclosure is any process that categorizes part files into groups and/or subgroups, such as, but not limited to, sheets, rods, wheels, gears, screws, and the like. A part classification model may be in communication with part database 116. A part classification model may be trained on training data correlating part files to part categories. Training data may be received from external computing devices user input, iterative processing, and the like. In some embodiments, a part classification model may be configured to input one or more part specification files and output one or more part categories, such as, but not limited to, sheets, screws, rods, bolts, and the like. In a non-limiting example, apparatus 104 may use a part classifier to classify a part specification file for a metal rod to a rod category.

Still referring to FIG. 1, apparatus 104 may include part database 116. Part database 116 may be implemented, without limitation, as a relational database, a key-value retrieval database such as a NOSQL database, or any other format or structure for use as a database that a person skilled in the art would recognize as suitable upon review of the entirety of this disclosure. Part database 116 may alternatively or additionally be implemented using a distributed data storage protocol and/or data structure, such as a distributed hash table or the like. Part database 116 may include a plurality of data entries and/or records as described above. Data entries in part database 116 may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a database may store, retrieve, organize, and/or reflect data and/or records as used herein, as well as categories and/or populations of data consistently with this disclosure.

Still referring to FIG. 1, part database 116 may include data of one or more parts. Data of one or more parts may include, but is not limited to, geometric features, scalar values, dimensions, part functionality, fit criteria, mechanical compatibility, and the like. Part data of part database 116 may be mapped by search index 112. Mapping may include, but is not limited to, linking one or more elements of data between two or more data files. In some embodiments, search index 112 may be configured to map two or more parts of part database 116 together. Search index 112 may map two or more parts of part database 116 together while comparing two or more parts as described above. In some embodiments, part database 116 may store mapping data of search index 112. Part database 116 may include links between two or more parts based on geometric features, part functionality, fit criteria, and the like. In a non-limiting example, part database 116 may include a link between two metal rods having a similar circumference and length. Part database 116 may include groupings of parts having a similarity. A grouping of parts may include, but is not limited to, a grouping of parts by material, a grouping of parts by function, a grouping of parts by dimension, a grouping of parts by geometric features, and the like. Part database 112 may be described further below with reference to FIG. 2.

Still referring to FIG. 1, search index 112 may be configured to generate part estimation 128. Part estimation 128 may include one or more parts having a similarity to part specification file 108. In some embodiments, search index 112 may generate part estimation 128 with a criteria threshold. A "criteria threshold" as used in this disclosure is a parameter tolerance level. In some embodiments, a criteria threshold may include a difference between geometric features, fit criteria, dimensions, part functionality, and the like of two or more parts. In some embodiments, a criteria threshold may be represented by a percentage value. In a non-limiting example, search index 112 may include a criteria threshold of 92%. Search index 112 may generate part estimation 128 which may include one or more parts having a similarity of 8% or more.

Still referring to FIG. 1, apparatus 104 may include an objective function. An "objective function" as used in this disclosure is a process of minimizing or maximizing one or more values based on a set of constraints. Apparatus 104 may generate an objective function to optimize a matching of two or more parts. In some embodiments, an objective function of apparatus 104 may include an optimization criterion. An optimization criterion may include any description of a desired value or range of values for one or more attributes of a part; desired value or range of values may include a maximal or minimal value, a range between maximal or minimal values, or an instruction to maximize or minimize an attribute. As a non-limiting example, an optimization criterion may specify that a geometric feature of a part should be within a 1% difference of another part; an optimization criterion may cap a volume of a part, for instance specifying that a part must not have a volume greater than a specified value. An optimization criterion may alternatively request that a part's volume be greater than a certain value. An optimization criterion may specify one or more tolerances for precision in part matching. An optimization criterion may specify one or more desired part criteria for a matching process. In an embodiment, an optimization criterion may assign weights to different attributes or values associated with attributes; weights, as used herein, may be multipliers or other scalar numbers reflecting a relative importance of a particular attribute or value. One or more weights may be expressions of value to a user of a particular outcome, attribute value, or other facet of a matching process; value may be expressed, as a non-limiting example, in remunerative form, such as a material quality, a quickest available part, or the like. As a non-limiting example, minimization of part searching time may be multiplied by a first weight, while tolerance above a certain value may be multiplied by a second weight. Optimization criteria may be combined in weighted or unweighted combinations into a function reflecting an overall outcome desired by a user; function may be a geometric feature function to be minimized and/or maximized. Function may be defined by reference to part criteria constraints and/or weighted aggregation thereof as provided by apparatus 104; for instance, a geometric feature function combining optimization criteria may seek to minimize or maximize a function of geometric feature matching.

Still referring to FIG. 1, apparatus 104 may use an objective function to compare part estimation 128 with matching part 132. Generation of an objective function may include generation of a function to score and weight factors to achieve a process score for each feasible pairing. In some embodiments, pairings may be scored in a matrix for optimization, where columns represent parts and rows represent matches potentially paired therewith; each cell of such a matrix may represent a score of a pairing of the corresponding part to the corresponding match. In some embodiments, assigning a predicted process that optimizes the objective function includes performing a greedy algorithm process. A "greedy algorithm" is defined as an algorithm that selects locally optimal choices, which may or may not generate a globally optimal solution. For instance, apparatus 104 may select pairings so that scores associated therewith are the best score for each part match and/or for each process. In such an example, optimization may determine the combination of part matches such that each object pairing includes the highest score possible.

Still referring to FIG. 1, an objective function may be formulated as a linear objective function. Apparatus 104 may solve an objective function using a linear program such as without limitation a mixed-integer program. A "linear program," as used in this disclosure, is a program that optimizes a linear objective function, given at least a constraint. For instance, and without limitation, objective function may seek to maximize a total score $\Sigma_{r \in R} \Sigma_{s \in S} c_{rs} x_{rs}$, where R is a set of all parts r, S is a set of all matches s, $c_{rs}$ is a score of a pairing of a given part with a given match, and $x_{rs}$ is 1 if a part r is paired with a match s, and 0 otherwise. Continuing the example, constraints may specify that each part is assigned to only one match, and each match is assigned only one part. Matches may include matching processes as described above. Sets of processes may be optimized for a maximum score combination of all generated processes. In various embodiments, apparatus 104 may determine a combination of parts that maximizes a total score subject to a constraint that all parts are paired to exactly one match. Not all matches may receive a part pairing since each match may only produce one part. In some embodiments, an objective function may be formulated as a mixed integer optimization function. A "mixed integer optimization" as used in this disclosure is a program in which some or all of the variables are restricted to be integers. A mathematical solver may be implemented to solve for the set of feasible pairings that maximizes the sum of scores across all pairings; mathematical solver may be implemented on apparatus 104 and/or another device in system 100, and/or may be implemented on third-party solver.

With continued reference to FIG. 1, optimizing an objective function may include minimizing a loss function, where a "loss function" is an expression an output of which an optimization algorithm minimizes to generate an optimal result. As a non-limiting example, apparatus 104 may assign variables relating to a set of parameters, which may correspond to score components as described above, calculate an output of mathematical expression using the variables, and select a pairing that produces an output having the lowest size, according to a given definition of "size," of the set of outputs representing each of plurality of candidate component combinations; size may, for instance, included absolute value, numerical size, or the like. Selection of different loss functions may result in identification of different potential pairings as generating minimal outputs. Objectives represented in an objective function and/or loss function may include minimization of search times. Objectives may include minimization of geometric feature differences. Objectives may include minimization of fit criteria differences. Objectives may include minimization of dimensional value differences. Objectives may include minimization of part quality differences.

Still referring to FIG. 1, apparatus 104 may be configured to generate part query 120. A "part query" as used in this disclosure is any request for data about an object and/or part. Part query 120 may query for a part identical and/or near identical to part specification file 108. Querying may include, but is not limited to, searching through databases, third party provider networks, and the like for possible matches of a part. In some embodiments, part query 120 may communicate with plurality of remote computing devices 124. Plurality of remote computing devices 124 may include any computing device as described. In some embodiments, plurality of remote computing devices 124 may include third party computing devices. Third party computing devices may include computing devices of manufacturing entities. In some embodiments, part query 120 may use data from search index 112 and/or part database 116 to narrow a query for a part. Part query 120 may utilize search index 112 to narrow querying criteria. "Querying criteria" as used in this disclosure are parameters that constrain a search. In some embodiments, querying criteria may include, but is not limited to, geometric features, scalar values, dimensions, and the like. Querying criteria may be used by part query 120 to constrain a search to a part category, such as, but not limited to, sheets, rods, screws, and the like. In some embodiments, part query 120 may constrain a search for one or more parts as a function of a query criteria of a material, such as, but not limited to, steel, copper, aluminum, alloys, wood, plastic, and the like. In some embodiments, querying criteria may include, but is not limited to, heights, widths, volumes, surface areas, angles, and the like. In a non-limiting example, part specification file 108 may identify a form of sheet metal having a steel material type and a surface area of 12 feet. Search index 112 may map the sheet metal of part specification file 108 to similar parts of part database 116. Search index 112 may communicate the mapping of part specification file 108 to part query 120. Part query 120 may use the mapping of part specification file 108 to search through databases, third party networks, and the like for a steel piece of sheet metal having a surface area of 12 feet. In some embodiments, part query 120 may communicate query results to part database 116 and/or search index 112. Search index 112 may use query results from part query 120 to update a mapping of parts. Search index 112 and part query 120 may communicate part data to one another which may enable search index 112 and/or part query 120 to become more precise.

Still referring to FIG. 1, part query 120 may be configured to output matching part 132 as a function of an objective function. Matching part 132 may include a part that may be identical and/or near identical to part specification file 108. In some embodiments, matching part 132 may include a part matching one or more part criteria of part specification file 108. In some embodiments, matching part 132 may include a "best" part available based on part specification file 108. A "best" part available may include a part within a certain part criteria threshold specified by part specification file 108 and/or from a user input. In some embodiments, part query 120 may be configured to output matching part 132 by matching a dimensional element of part specification file 108 to a dimensional element of part estimation 128. A "dimensional element" as used in this disclosure is any information pertaining to measurements of an object and/or objects. In some embodiments, part query 120 may match one or more dimensional elements of part specification file 108 to one or more dimensional elements of part estimation 128 as a function of a dimensional element threshold. A "dimensional element threshold" as used in this disclosure is a tolerance level of a difference of one or more measurements of two or more objects and/or parts. As a non-limiting example, a dimensional element threshold may specify that a width difference of two parts should not exceed 2%. In some embodiments, part query 120 may be configured to match a plurality of geometric features of part specification file 108 to part estimation 128. In some embodiments, part query 120 may be configured to match part specification file 108 to part estimation 128 as a function of a geometric feature threshold. A "geometric feature threshold" as used in this disclosure is a tolerance level of a difference between one or more geometric features of two or more objects and/or parts. As a non-limiting example, a geometric feature threshold may specify that a curvature between two parts should be within 2.5 degrees. In another non-limiting example, a geometric feature threshold may specify that a surface area difference between two parts should be within 1% of each other. In some embodiments, a geometric feature threshold may include a bounding box model. A "bounding box model" as used in this disclosure is a minimum volume for a set of points that completely contains the union of the points in the set. A bounding box model may include, but is not limited to, a cuboid, swept sphere, cylinder, ellipsoid, sphere, slab, triangle, convex hull, discrete oriented polytope (DOP), and the like. As a non-limiting example, a bounding box model may include a 2-D rectangle having a width of 10 and a height of 20. The area of the 2-D rectangle may include all values of a tolerance range of a surface area of a part, for example between 10 square feet to 200 square feet. In some embodiments, matching part 132 may be rejected and/or accepted by a user, external computing device, and the like. In some embodiments, a rejection of matching part 132 may trigger another cycle of generation of part estimation 128 and/or part query 120. Matching part 132 may be updated repeatedly until a desired part is accepted. In some embodiments, matching part 132 may be communicated to part database 116. Search index 112 may update a mapping of parts of part database 116 as a function of matching part 132. Part estimation 128 may be updated as a function of search index 112 updating part database 116. In some embodiments, part query 120 may be updated as a function of matching part 132 and/or part estimation 128. In some embodiments, matching part 132 may be received from a local computing system and/or database. In other embodiments, apparatus 104 may communicate with plurality of remote computing devices 124 to receive matching part 132.

Figure 2:
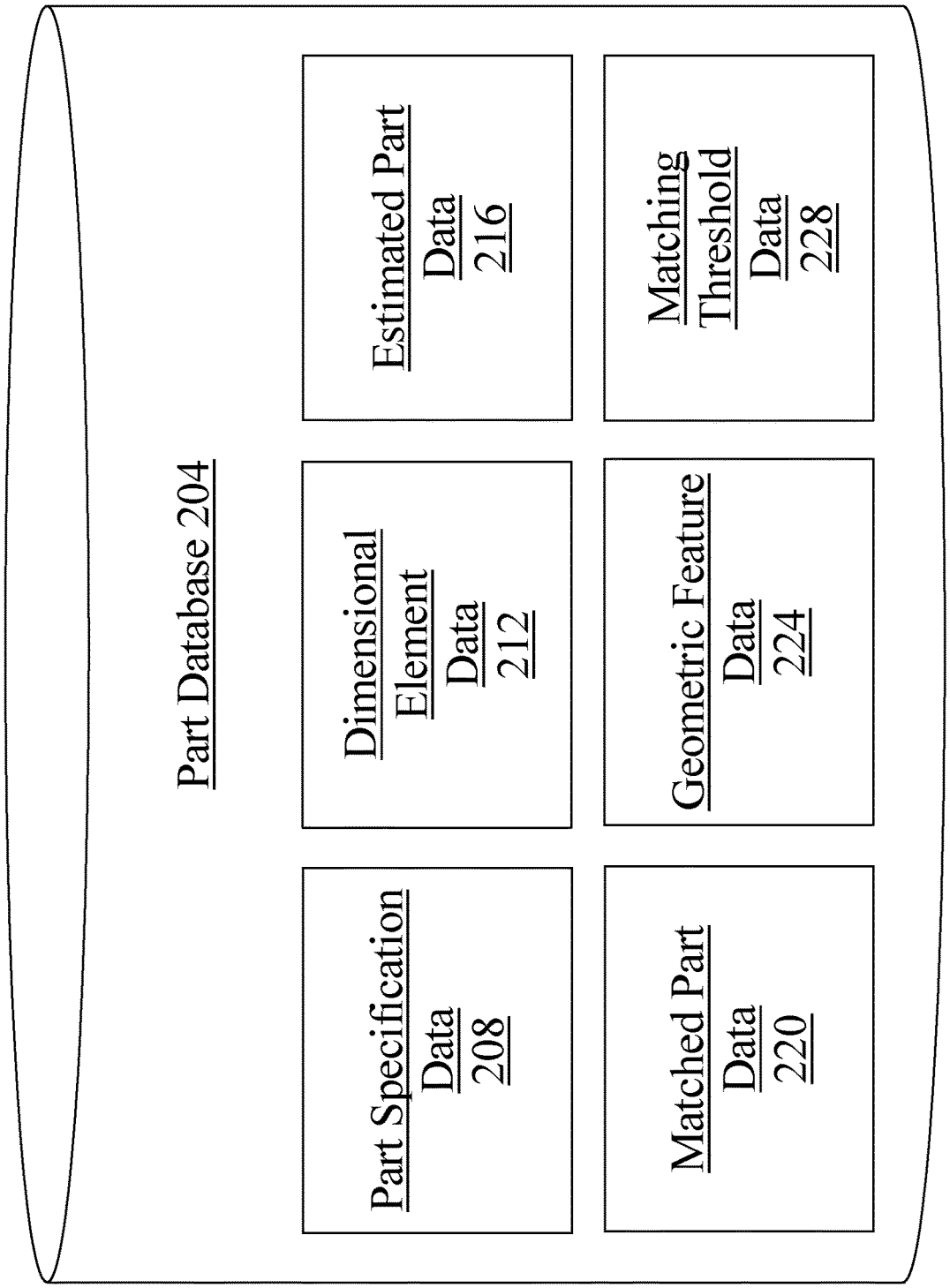
FIG. 2 is a block diagram of an exemplary embodiment of a manufacturing database.

Referring now to FIG. 2, part database 204 is shown. Part database 204 may include data of a plurality of parts. In some embodiments, part database 204 may include part specification data 208. Part specification data 208 may include data pertaining to one or more part specification files. Part specification data 208 may include meta data of one or more part specification files. Meta data may include, but is not limited to, file size, date created, author, and the like. In some embodiments, part specification data 208 may include categories of parts. Categories of parts may include, but is not limited to, frameworks, securing mechanisms, sheets, rods, and the like.

Still referring to FIG. 2, part database 204 may include dimensional element data 212. Dimensional element data 212 may include a plurality of dimensions of a plurality of parts. Dimensions may include, but are not limited to, height, length, width, thickness, circumference, diameter, radius, volume, surface area, angles, and the like. Dimensional element data 212 may link dimensional data to part specification data 208. As a non-limiting example, part specification 208 may include a metal rod and dimensional element data 212 may include the length, width, height, volume and the like of the metal rod. In some embodiments, dimensional element data 212 may be received from part specification data 208. In other embodiments, dimensional element data 212 may be received through user input.

Still referring to FIG. 2, part database 204 may include estimated part data 216. Estimated part data 216 may include data of part estimations generated by search index 112. In some embodiments, estimated part data may include an estimated part's function, geometric features, fit criteria, dimensions, and the like. In some embodiments, estimated part data 216 may include an accuracy score. An accuracy score may include a numerical value attributed to a difference between a matching part and an estimated part generated by search index 112. As a non-limiting example, estimated part data 216 may include a shaped metal rod paired with an accuracy score of 87%. The shaped metal rod may have a differing dimension, fit criteria, material and the like from an actual matching part, which may affect the estimated parts accuracy score. In some embodiments, estimated part data 216 may include a group of estimated parts. A group of estimated parts may include parts having similar part attributes that may have been selected for an initial part estimation. In some embodiments, estimated part data 216 may include a history of part estimations.

Still referring to FIG. 2, part database 204 may include matched part data 220. Matched part data 220 may include data of parts that matched part criteria of part query 120. Matched part data 220 may include matching part dimensions, fit criteria, geometric features, identifies, manufacturers, and the like. In a non-limiting example, matched part data 220 may include dimensions of a steel rod with an identification code of 323H and manufacturing data showing the entity that produced the steel rod, such as "Joe's Parts".

In some embodiments, matched part data 220 may communicated part data to estimated part data 216. Estimated part data may use part data from matched part data 220 to update accuracy scores and the like. Search index 112 may use estimated part data 216 to become more accurate in generating a part estimation.

Still referring to FIG. 2, part database 204 may include geometric feature data 224. Geometric feature data 224 may include a plurality of geometric features of a plurality of parts. Geometric feature data 224 may include, but is not limited to, heights, widths, lengths, thickness, volumes, surface areas, curvatures, angles, and the like. In some embodiments, geometric feature data 224 may link a part to one or more geometric features. As a non-limiting example, geometric feature data 224 may include a moment of inertia of 0.05 I ($kg*m^2$) of a sheet metal.

Still referring to FIG. 2, part database 204 may include matching threshold data 228. Matching threshold data 228 may include data of a part criteria threshold. A part criteria threshold may include a difference between a part criteria of a part specification file and a matching part. In some embodiments, matching threshold data 228 may include a percent value difference between a matching part and a part specification file. In a non-limiting example, matching threshold data 228 may include a matching threshold of 0.1%. In some embodiments, matching threshold data 228 may include differing thresholds for two or more part criterion. As a non-limiting example, matching threshold data 228 may include a threshold for a difference between a part specification file and a matching part's volume of 0.8% and a difference of a part specification file and a matching part's curvature of 0.2%.

Figure 3:
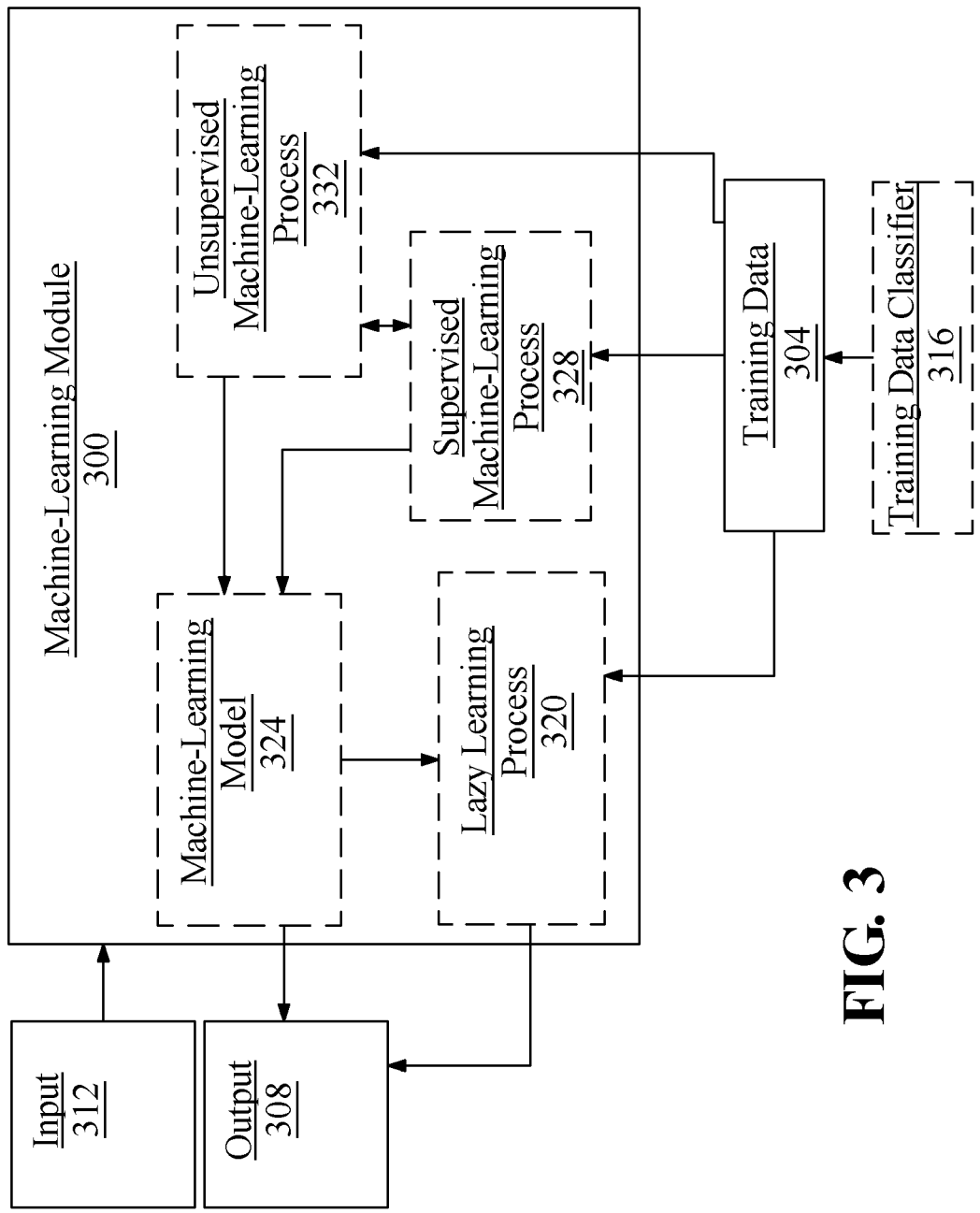
FIG. 3 is a block diagram of a machine learning model.

Referring now to FIG. 3, an exemplary embodiment of a machine-learning module 300 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 304 to generate an algorithm that will be performed by a computing device/module to produce outputs 308 given data provided as inputs 312; this is in contrast to a non-machine learning software program where the commands to be executed are determined in advance by a user and written in a programming language.

Still referring to FIG. 3, "training data," as used herein, is data containing correlations that a machine-learning process may use to model relationships between two or more categories of data elements. For instance, and without limitation, training data 304 may include a plurality of data entries, each entry representing a set of data elements that were recorded, received, and/or generated together; data elements may be correlated by shared existence in a given data entry, by proximity in a given data entry, or the like. Multiple data entries in training data 304 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 304 according to various correlations; correlations may indicate causative and/or predictive links between categories of data elements, which may be modeled as relationships such as mathematical relationships by machine-learning processes as described in further detail below. Training data 304 may be formatted and/or organized by categories of data elements, for instance by associating data elements with one or more descriptors corresponding to categories of data elements. As a non-limiting example, training data 304 may include data entered in standardized forms by persons or processes, such that entry of a given data element in a given field in a form may be mapped to one or more descriptors of categories. Elements in training data 304 may be linked to descriptors of categories by tags, tokens, or other data elements; for instance, and without limitation, training data 304 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 3, training data 304 may include one or more elements that are not categorized; that is, training data 304 may not be formatted or contain descriptors for some elements of data. Machine-learning algorithms and/or other processes may sort training data 304 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 304 to be made applicable for two or more distinct machine-learning algorithms as described in further detail below. Training data 304 used by machine-learning module 300 may correlate any input data as described in this disclosure to any output data as described in this disclosure. As a non-limiting illustrative example input data may include design files and output data may include manufacturing processes.

Further referring to FIG. 3, training data may be filtered, sorted, and/or selected using one or more supervised and/or unsupervised machine-learning processes and/or models as described in further detail below; such models may include without limitation a training data classifier 316. Training data classifier 316 may include a "classifier," which as used in this disclosure is a machine-learning model as defined below, such as a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. Machine-learning module 300 may generate a classifier using a classification algorithm, defined as a processes whereby a computing device and/or any module and/or component operating thereon derives a classifier from training data 304. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 316 may classify elements of training data to stages of a manufacturing process.

Still referring to FIG. 3, machine-learning module 300 may be configured to perform a lazy-learning process 320 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 304. Heuristic may include selecting some number of highest-ranking associations and/or training data 304 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 3, machine-learning processes as described in this disclosure may be used to generate machine-learning models 324. A "machine-learning model," as used in this disclosure, is a mathematical and/or algorithmic representation of a relationship between inputs and outputs, as generated using any machine-learning process including without limitation any process as described above, and stored in memory; an input is submitted to a machine-learning model 324 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 324 may be generated by creating an artificial neural network, such as a convolutional neural network comprising an input layer of nodes, one or more intermediate layers, and an output layer of nodes. Connections between nodes may be created via the process of "training" the network, in which elements from a training data 304 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 3, machine-learning algorithms may include at least a supervised machine-learning process 328. At least a supervised machine-learning process 328, as defined herein, include algorithms that receive a training set relating a number of inputs to a number of outputs, and seek to find one or more mathematical relations relating inputs to outputs, where each of the one or more mathematical relations is optimal according to some criterion specified to the algorithm using some scoring function. For instance, a supervised learning algorithm may include design files as described above as inputs, manufacturing processes as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 304. Persons skilled in the art, upon reviewing the entirety of this disclosure, will be aware of various possible variations of at least a supervised machine-learning process 328 that may be used to determine relation between inputs and outputs. Supervised machine-learning processes may include classification algorithms as defined above.

Further referring to FIG. 3, machine learning processes may include at least an unsupervised machine-learning processes 332. An unsupervised machine-learning process, as used herein, is a process that derives inferences in datasets without regard to labels; as a result, an unsupervised machine-learning process may be free to discover any structure, relationship, and/or correlation provided in the data. Unsupervised processes may not require a response variable; unsupervised processes may be used to find interesting patterns and/or inferences between variables, to determine a degree of correlation between two or more variables, or the like.

Still referring to FIG. 3, machine-learning module 300 may be designed and configured to create a machine-learning model 324 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 3, machine-learning algorithms may include, without limitation, linear discriminant analysis. Machine-learning algorithm may include quadratic discriminate analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized tress, AdaBoost, gradient tree boosting, and/or voting classifier methods. Machine-learning algorithms may include neural net algorithms, including convolutional neural net processes.

Figure 4:
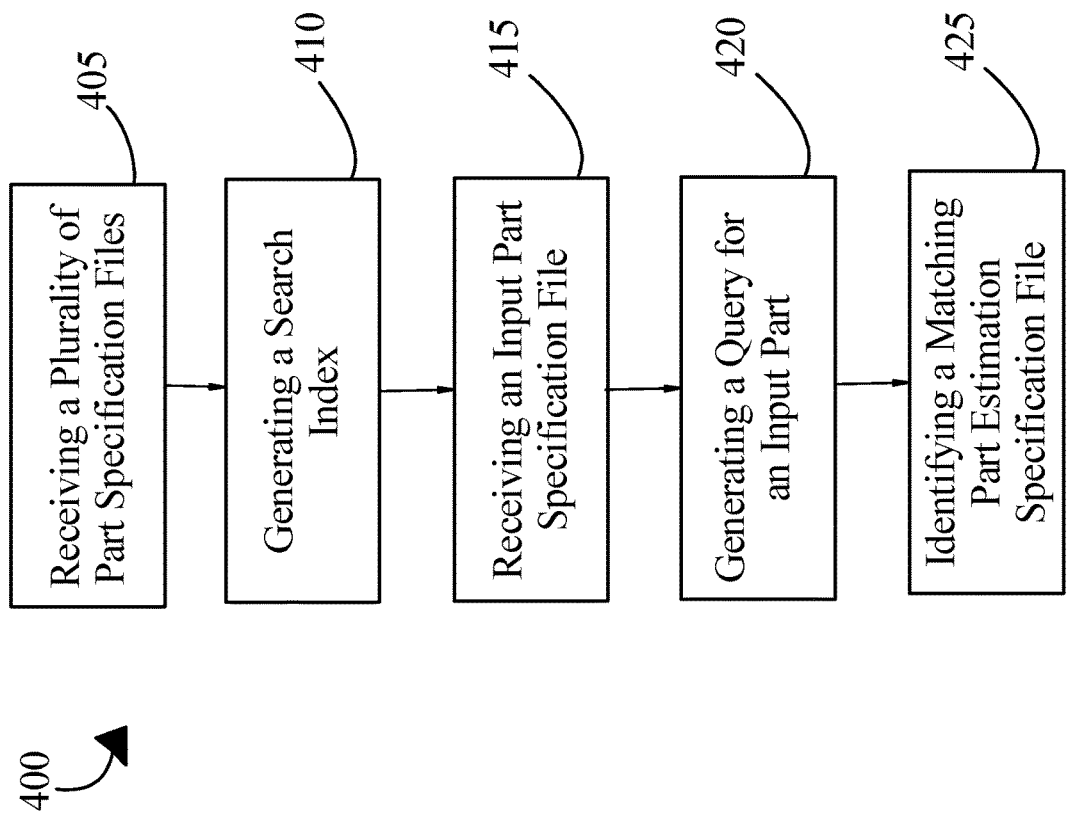
FIG. 4 is a flowchart of a method of geometric searching of a part.

Referring now to FIG. 4, a method 400 of geometric searching for a part using a computing device is presented. At step 405, method 400 includes receiving a plurality of part specification files. Each specification of the plurality of part specification files may include geometric features. This step may be implemented as described above in FIGS. 1-3.

Still referring to FIG. 4, at step 410, method 400 includes generating a search index. A search index may compare and/or map one or more parts of a part database. In some embodiments, a search index may be generated to map parts as a function of a part criteria. A part criteria may include, but is not limited to, geometric features, dimensional elements, part functionality, and the like. This step may be implemented as described above in FIGS. 1-3.

Still referring to FIG. 4, at step 415, method 400 includes receiving an input part specification file. An input part specification file may include geometric features. In some embodiments, an input part specification file may be received from a remote computing device. In some embodiments, an input part specification file may be received from a user at a computing device of method 400. This step may be implemented as described above in FIGS. 1-3.

Still referring to FIG. 4, at step 420, method 400 includes generating a query for an input part. A query may include a search for a matching part of an input part. A query may be performed on a local network. In some embodiments, generating a query may include querying database and/or remote external computing devices of third parties. In some embodiments, a query may include a querying criteria. A querying criteria may include, but is not limited to, differences in dimensions, materials, geometric features, scale, and the like between an input part and a potential matching part. This step may be implemented as described above in FIGS. 1-3.

Still referring to FIG. 4, at step 425, method 400 includes identifying a matching part estimation specification file. A matching part estimation specification file may include a part located in a local and/or exterior database. A matching part estimation specification file may include a file identical and/or near identical to an input part specification file. This step may be implemented as described above in FIGS. 1-3.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 5:
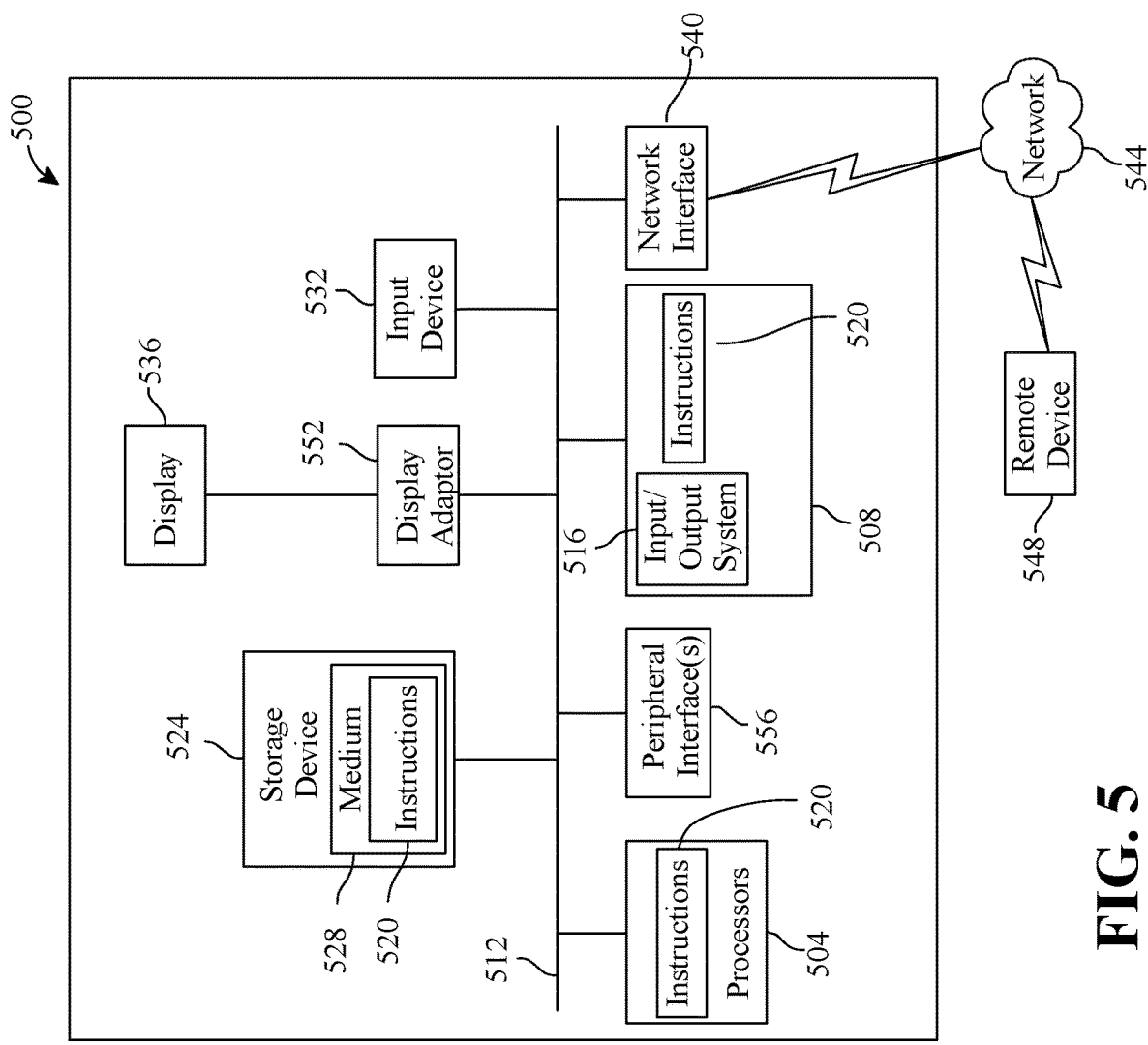
FIG. 5 is a block diagram of a computing system that can be used to implement any one or more of the methodologies disclosed herein and any one or more portions thereof.

FIG. 5 shows a diagrammatic representation of one embodiment of a computing device in the exemplary form of a computer system 500 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 500 includes a processor 504 and a memory 508 that communicate with each other, and with other components, via a bus 512. Bus 512 may include any of several types of bus structures including, but not limited to, a memory bus, a memory controller, a peripheral bus, a local bus, and any combinations thereof, using any of a variety of bus architectures.

Still referring to FIG. 5, processor 504 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 504 may be organized according to Von Neumann and/or Harvard architecture as a non-limiting example. Processor 504 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Still referring to FIG. 5, memory 508 may include various components (e.g., machine-readable media) including, but not limited to, a random-access memory component, a read only component, and any combinations thereof. In one example, a basic input/output system 516 (BIOS), including basic routines that help to transfer information between elements within computer system 500, such as during start-up, may be stored in memory 508. Memory 508 may also include (e.g., stored on one or more machine-readable media) instructions (e.g., software) 520 embodying any one or more of the aspects and/or methodologies of the present disclosure. In another example, memory 508 may further include any number of program modules including, but not limited to, an operating system, one or more application programs, other program modules, program data, and any combinations thereof.

Still referring to FIG. 5, computer system 500 may also include a storage device 524. Examples of a storage device (e.g., storage device 524) include, but are not limited to, a hard disk drive, a magnetic disk drive, an optical disc drive in combination with an optical medium, a solid-state memory device, and any combinations thereof. Storage device 524 may be connected to bus 512 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 524 (or one or more components thereof) may be removably interfaced with computer system 500 (e.g., via an external port connector (not shown)). Particularly, storage device 524 and an associated machine-readable medium 528 may provide nonvolatile and/or volatile storage of machine-readable instructions, data structures, program modules, and/or other data for computer system 500. In one example, software 520 may reside, completely or partially, within machine-readable medium 528. In another example, software 520 may reside, completely or partially, within processor 504.

Still referring to FIG. 5, computer system 500 may also include an input device 532. In one example, a user of computer system 500 may enter commands and/or other information into computer system 500 via input device 532. Examples of an input device 532 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 532 may be interfaced to bus 512 via any of a variety of interfaces (not shown) including, but not limited to, a serial interface, a parallel interface, a game port, a USB interface, a FIREWIRE interface, a direct interface to bus 512, and any combinations thereof. Input device 532 may include a touch screen interface that may be a part of or separate from display 536, discussed further below. Input device 532 may be utilized as a user selection device for selecting one or more graphical representations in a graphical interface as described above.

Still referring to FIG. 5, a user may also input commands and/or other information to computer system 500 via storage device 524 (e.g., a removable disk drive, a flash drive, etc.) and/or network interface device 540. A network interface device, such as network interface device 540, may be utilized for connecting computer system 500 to one or more of a variety of networks, such as network 544, and one or more remote devices 548 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 544, may employ a wired and/or a wireless mode of communication. In general, any network topology may be used. Information (e.g., data, software 520, etc.) may be communicated to and/or from computer system 500 via network interface device 540.

Still referring to FIG. 5, computer system 500 may further include a video display adapter 552 for communicating a displayable image to a display device, such as display device 536. Examples of a display device include, but are not limited to, a liquid crystal display (LCD), a cathode ray tube (CRT), a plasma display, a light emitting diode (LED) display, and any combinations thereof. Display adapter 552 and display device 536 may be utilized in combination with processor 504 to provide graphical representations of aspects of the present disclosure. In addition to a display device, computer system 500 may include one or more other peripheral output devices including, but not limited to, an audio speaker, a printer, and any combinations thereof. Such peripheral output devices may be connected to bus 512 via a peripheral interface 556. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for geometric part searching, comprising:
at least a processor and a memory communicatively connected to the at least a processor, the memory containing instructions configuring the at least a processor to:
  receive a plurality of part specification files, wherein each part specification file of the plurality of part specification files comprises at least a geometric feature;
  determine a scalar variable of the at least a geometric feature of each part specification file of the plurality of part specification files;
  generate a search index as a function of the plurality of part specification files, wherein the search index is configured to map, as a function of the scalar variable, at least a part specification file of the plurality of part specification files to another part specification file in a part specification file database, wherein the search index is further configured to utilize a part matching machine learning model, wherein utilizing the part matching machine learning model comprises:
    training a part matching machine learning model using part training data wherein part training data correlates inputs containing part datum elements to outputs containing matching parts, wherein training the part matching machine learning model comprises:
      updating the part training data as a function of an input and output result from the part matching machine learning model; and
      retraining the part matching machine learning model with the updated part training data;
  receive an input part specification file, wherein the input part specification file comprises a plurality of geometric features;
  generate a query for an input part as a function of the input part specification file and the search index, wherein the query is configured to:
    match a dimensional element of the input part specification file to a dimensional element of part estimation specification file of the search index as a function of a dimensional element threshold; and
    output a comparison of the input part specification file to the part estimation specification file of the search index as a function of the matching of the dimensional element of the input part specification file to the part estimation specification file, wherein the comparison of the input part specification file to the part estimation specification file comprises:
      a mechanical compatibility comparison to determine a likeliness of a structural connection between the dimensional element of the input part specification file and the dimensional element of the part estimation specification file;
      a fit criteria comparison, wherein the fit criteria comprises a set of geometric prerequisites needed for an object to connect another object;
      a part functionality comparison wherein the part functionality comparison comprises:
        vibrational qualities, including at least resonant frequency;
        a rotationality, wherein the rotationality includes an ability of the part to rotate about an axis; and
        a flexibility; and
      a geometric feature comparison;
  generate an objective function comprising a minimizing loss function further comprising minimization of at least fit criteria differences;
  identify a matching part estimation specification file from a plurality of query results generated from the query;
  output the matching part based on the objective function and the comparison of the input part specification file to the part estimation specification file; and
  receive an authorization from a user for the matching part.

2. The system of claim 1, wherein the search index is further configured to update a mapping of the at least a part specification file to another part specification file of a part specification file database as a function of the output of the query.

3. The system of claim 1 wherein the query is further configured to match the plurality of geometric features of the input part specification file to a part estimation specification file of the search index as a function of a geometric threshold.

4. The system of claim 1, wherein the at least a processor is further configured to classify, using a part classification model, each part specification file of the plurality of part specification files to a part category.

5. The system of claim 1, wherein the plurality of part specification files further comprise a set of metadata.

6. The system of claim 5, wherein the at least a processor is further configured to generate the search index as a function of the set of metadata of the plurality of part specification files.

7. The system of claim 1, wherein the at least a processor is further configured to generate a dimensional projection of a part specification file of the plurality of part specification files.

8. The system of claim 1, wherein the at least a processor is configured to communicate with a part estimation database.

9. The apparatus of claim 1, wherein generating the search index further comprises:

receiving training data, wherein the training data comprises geometric features correlated to part specifications;

training a specification machine learning model with the training data, wherein responsive to training the specification machine learning model is configured to input a plurality of geometric features and out a part specification; and pairing at least one part specification file to a matching part specification file as a function of the specification machine learning model.

10. A method of geometric part searching using a computing device, comprising:

receiving a plurality of part specification files, wherein each part specification file of the plurality of part specification files comprises at least a geometric feature;

determining a scalar variable of the at least a geometric feature of each part specification file of the plurality of part specification files;

generating a search index as a function of the plurality of part specification files, wherein the search index is configured to map, as a function of the scalar variable, at least a part specification file of the plurality of part specification files to another part specification file in a part specification file database, wherein the search index is further configured to utilize a part matching machine learning model, wherein utilizing the part matching model comprises:

training a part matching machine learning model using part training data wherein part training data correlates inputs containing part datum elements to outputs containing matching parts, wherein training the part matching machine learning model comprises:

updating the part training data as a function an input and output result from the part matching machine learning model; and retraining the part matching machine learning model with the updated part training data;

receiving an input part specification file, wherein the input part specification file comprises a plurality of geometric features;

generating a query for an input part as a function of the input part specification file and the search index, wherein the query is configured to:

match a dimensional element of the input part specification file to a dimensional element of the part estimation specification file of the search index as a function of a dimensional element threshold; and output a comparison of the input part specification file to the part estimation specification file of the search index as a function of the matching of the dimensional element of the input part specification file to the part estimation specification file, wherein the comparison of the input part specification file to the part estimation specification file comprises:

a mechanical compatibility comparison to determine a likeliness of a structural connection between the dimensional element of the input part specification file and the dimensional element of the part estimation specification file;

a fit criteria comparison, wherein the fit criteria comprises a set of geometric prerequisites needed for an object to connect another object;

a part functionality comparison, wherein the part functionality comparison comprises:

vibrational qualities, including at least resonant frequency;

a rotationality, wherein the rotationality includes an ability of the part to rotate about an axis; and a flexibility; and a geometric feature comparison;

generating an objective function comprising a minimizing loss function further comprising minimization of at least fit criteria differences; and identifying a matching part estimation specification file from a plurality of query results generated from the query outputting the matching part based on the objective function and the comparison of the input part specification file to the part estimation specification file; and receiving an authorization from a user for the matching part.

11. The method of claim 10, wherein the search index is further configured to update a mapping of the at least a part specification file to another part specification file of a part specification file database as a function of the output of the query.

12. The method of claim 10 wherein query is further configured to match the plurality of geometric features of the input part specification file to a part estimation specification file of the search index as a function of a geometric threshold.

13. The method of claim 10, wherein the computing device is further configured to classify, using a part classification model, each part specification file of the plurality of part specification files to a part category.

14. The method of claim 10, wherein the plurality of part specification files further comprises a set of metadata.

15. The method of claim 13, wherein the computing device is further configured to generate the search index as a function of the set of metadata of the plurality of part specification files.

16. The method of claim 10, wherein the computing device is further configured to generate a dimensional projection of a part specification file of the plurality of part specification files.

17. The method of claim 10, wherein the computing device is configured to communicate with a part estimation database.

18. The method of claim 10, wherein generating the search index further comprises:

receiving training data, wherein the training data comprises geometric features correlated to part specifications;

training a specification machine learning model with the training data, wherein responsive to training the specification machine learning model is configured to input a plurality of geometric features and out a part specification; and pairing at least one part specification file to a matching part specification file as a function of the specification machine learning model.

19. The system of claim 1, wherein the part functionality comparison further comprises a structural support of the part.

20. The method of claim 10, wherein the part functionality comparison further comprises a structural support of the part.

* * * * *